(12) United States Patent
Gogl et al.

(10) Patent No.: US 6,498,747 B1
(45) Date of Patent: Dec. 24, 2002

(54) MAGNETORESISTIVE RANDOM ACCESS MEMORY (MRAM) CROSS-POINT ARRAY WITH REDUCED PARASITIC EFFECTS

(75) Inventors: Dietmar Gogl, Essex Junction, VT (US); Hans Viehmann, S. Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/068,913

(22) Filed: Feb. 8, 2002

(51) Int. Cl.[7] .............................................. G11C 11/00
(52) U.S. Cl. ...................... 365/158; 365/171; 365/173; 365/51; 365/66; 365/63
(58) Field of Search .............................. 365/158, 171, 365/173, 210, 51, 66, 63

(56) References Cited

U.S. PATENT DOCUMENTS

| | | | |
|---|---|---|---|
| 5,946,227 A | * | 8/1999 | Naji ........................... 365/158 |
| 6,351,410 B1 | * | 2/2002 | Nakao et al. ................ 365/171 |
| 6,385,079 B1 | * | 5/2002 | Tran ............................ 365/148 |
| 6,385,082 B1 | * | 5/2002 | Abraham et al. ........... 365/145 |
| 6,388,917 B2 | * | 5/2002 | Hoffmann et al. .......... 365/158 |
| 6,392,924 B1 | * | 5/2002 | Liu et al. .................... 365/158 |

* cited by examiner

Primary Examiner—Andrew Q. Tran
Assistant Examiner—Toan Le
(74) Attorney, Agent, or Firm—Slater & Matsil, L.L.P.

(57) ABSTRACT

An architecture for a magnetoresistive random access memory (MRAM) storage cell 300 with reduced parasitic effects is presented. An additional runs of metal laid in parallel to both the wordline 310 and the bitlines 320 of the MRAM device provide a write wordline 345 and a write bitline 355 are separated from the wordline and the bitline by a dielectric layer 340 and 350 provides electrical isolation of the write currents from the magnetic stacks. The electrical isolation of the write wordline 345 and bitlines 355 reduces the parasitic capacitance, inductance, and resistance seen by the wordline and bitlines during the write operation. The wordline 310 and bitlines 320 remain as in a standard MRAM cross-point array architecture and is dedicated for reading the contents of the MRAM storage cell.

22 Claims, 2 Drawing Sheets

MAGNETORESISTIVE RANDOM ACCESS MEMORY (MRAM) CROSS-POINT ARRAY WITH REDUCED PARASITIC EFFECTS

FIELD OF THE INVENTION

This invention relates generally to semiconductor memory devices, and particularly to cross-point array architecture for magnetoresistive random access memory (MRAM) storage devices.

BACKGROUND OF THE INVENTION

Semiconductor devices are used for integrated circuits in a wide variety of electrical and electronic applications, such as computers, cellular telephones, radios, and televisions. One particular type semiconductor device is a semiconductor storage device, such as random access memory (RAM) and flash memory. These semiconductor storage devices use an electrical charge to store information.

A recent development in semiconductor memory devices involves spin electronics, which combines traditional semiconductor technology and magnetism. Rather than using an electrical charge to indicate the presence of a binary "1" or "0", the spin of an electron is used. An example of such a spin electronic device is a magnetoresistive random access memory (MRAM) storage device, which includes conductive lines positioned perpendicular to one another in different metal layers. The place where the conductive lines intersect is known as a cross-point. In between the perpendicular conductive lines is a magnetic stack. The magnetic stack is placed at the cross-point, sandwiched between the conductive lines.

An electrical current flowing through one of the conductive lines induces a magnetic field around the conductive line. The induced magnetic field can align (or orient) the alignment (or orientation) of magnetic dipoles in the magnetic stack. The right hand rule is a way to determine the direction of a magnetic field induced by a current flowing in a particular direction. The right hand rule is well understood by those of ordinary skill in the art of the present invention.

A different current flowing through the other conductive line induces another magnetic field and can realign the polarity of the magnetic field in the magnetic stack. Binary information, represented as a "0" or "1", is stored as different alignments of the magnetic dipoles in the magnetic stack. A current of sufficient strength flowing through one of the conductive lines is sufficient to destroy the contents of the magnetic stacks coupled to it. However, currents flowing through both conductive lines are required to selectively program a particular magnetic stack.

The alignment of the magnetic dipoles in the magnetic stack changes the electrical resistance of the magnetic stack. For example, if a binary "0" is stored in the magnetic stack, the resistance of the magnetic stack will be different from the resistance of the same magnetic stack if a binary "1" is stored in the magnetic stack. It is the resistance of the magnetic stack that is detected and determines the logical value stored therein.

It is preferable to use long runs of the conductive lines to maximize storage density. The long conductive lines permit larger storage arrays and minimizes area overhead for support logic and devices such as current drivers and sinks, switches, etc. However, long conductive lines result in significant parasitic effects such as capacitance, inductance, and resistance. By reducing parasitic effects, the following advantages may be realized: precise control of writing current, longer conductive lines, shielding of read lines, and reduced power consumption.

Because MRAM devices operate differently than traditional semiconductor memory devices, they introduce design and manufacturing challenges. A need has therefore arisen for a cross-point array architecture to reduce parasitic effects.

SUMMARY OF THE INVENTION

In one aspect, the present invention provides an architecture for a magnetoresistive random access memory (MRAM) storage cell comprising a magnetic tunnel junction (MTJ), a wordline and a bitline perpendicular to the wordline, sandwiching the MTJ at their intersection, a first conductive line running parallel to the wordline, electrically separated from the wordline by a dielectric layer and a second conductive line running parallel to the bitline, electrically separated from the bitline by another dielectric layer.

In another aspect, the present invention provides an architecture for a magnetoresistive random access memory (MRAM) memory array arranged in a cross-point array with a plurality of wordlines and bitlines, the memory array comprising a plurality of MRAM memory cells arranged in a cross-point array, each MRAM memory cell comprising: a magnetic tunnel junction (MTJ) comprising a first and second magnetic layers separated by a non-magnetic layer, a wordline and a bitline lying perpendicular to the wordline, sandwiching the MTJ at their intersection, a first conductive line running parallel to the wordline, electrically separated from the wordline by a first dielectric layer; and a second conductive line running parallel to the bitline, electrically separated from the bitline by a second dielectric layer; and wherein subsets of MRAM memory cells are grouped together and share a common wordline and subsets of MRAM memory cells are grouped together and share a common bitline.

The present invention provides a number of advantages. For example, use of a preferred embodiment of the present invention permits precise control of the currents used to align the magnetic dipoles of the magnetic stacks. Precise control of the currents is possible due to the reduction in the parasitic effects, which in turn, reduces signal loss.

Also, the present invention provides a longer overall length for the conductive lines used in reading and writing the magnetic stacks. The longer length conductive lines allow for larger memory arrays, which in turn results in memory cells with greater density.

Additionally, the shielding of the read conductive lines allow for lower read currents to be used. Along with increased noise immunity due to the shielding, shortening of the read access time and the read cycle time can be achieved. The lower read currents also result in reduced power consumption.

Also, the present invention permits shorter read and write times due to the electrically separated architectures allowing read and write currents to be simultaneously maintained on the respective conductive lines, rather than having to switch from a read current to a write current as in other non-electrically separated architectures.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Figure 1:
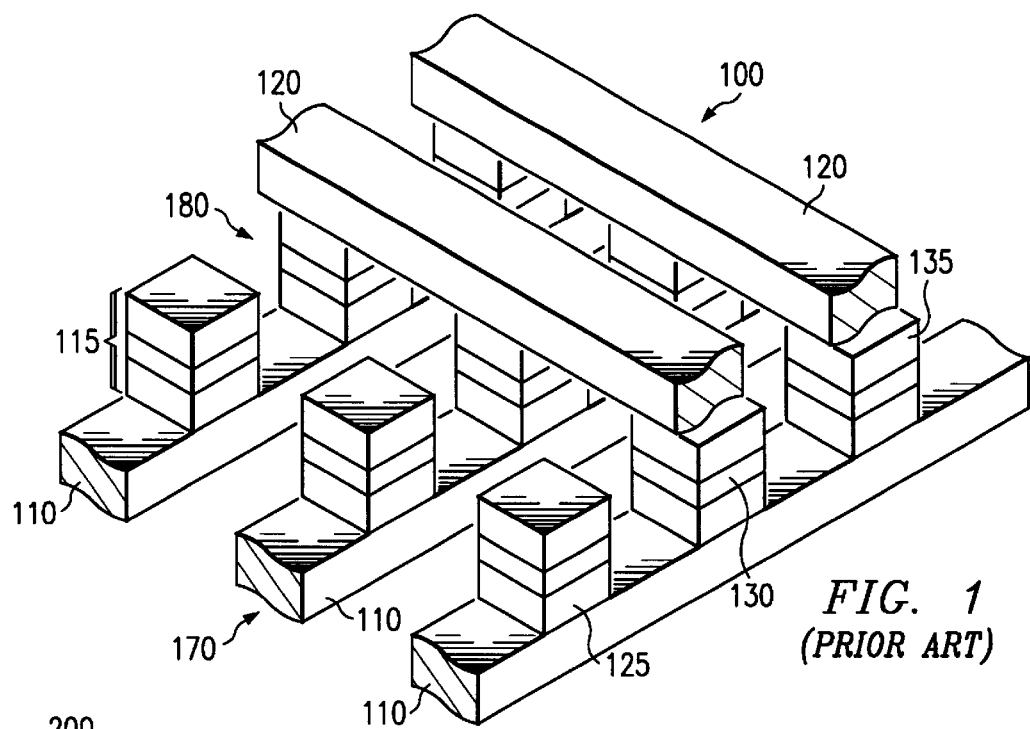
FIG. 1 illustrates a perspective view of a prior art MRAM storage device having magnetic stacks arranged in an array.

FIG. 1 illustrates a perspective view of a prior art MRAM storage device 100 having magnetic stacks arranged in a cross-point array. The device 100 has conductive lines 110 and 120 running in a first and second direction and comprised of a conductive material such as aluminum or copper. A magnetic stack 115 is formed over conductive line 110.

The magnetic stack 115 typically comprises a first magnetic layer 125, a dielectric layer 130, and a second magnetic layer 135. The magnetic layers 125 and 135 may be made of materials such as PtMn, CoFe, Ru, and NiFe while the dielectric layer 130 may be made of $Al_2O_3$. The first magnetic layer 125 is often referred to as a hard magnetic layer (or hard layer) while the second magnetic layer 135 is often referred to as a soft magnetic layer (or soft layer). The soft magnetic layer is sometimes referred to as the easy magnetic layer. The magnetic stack 115 is commonly referred to as a magnetic tunnel junction (MTJ).

Conductive lines 120, formed within a different metalization layer from the conductive lines 110, run in a different direction than (for example, perpendicular to) the conductive lines 110 are formed over the magnetic stacks 115. The conductive lines 110 and 120 function as the wordlines and bitlines of the storage device 100. The order of the magnetic stack 115 layers may be reversed, e.g., the hard layer 125 may be at the top while the soft layer 135 may be at the bottom of the magnetic stack 115. Similarly, the wordlines and the bitlines may be either above or below the magnetic stack 115.

FIG. 1 also displays a grouping of the magnetic stacks 115. A first grouping 170 displays a group of magnetic stacks sharing a common conductive line 110 while a second grouping 180 displays a group of magnetic stacks sharing a common conductive line 120. Each of the two groupings displays magnetic stacks sharing a common conductive line such as a wordline or a bitline. Each individual magnetic stack is a part of two groupings; one grouping shares a common wordline with the magnetic stack while the other grouping shares a common bitline with the magnetic stack. This basic architecture provides the basis for the cross-point array.

Figure 2:
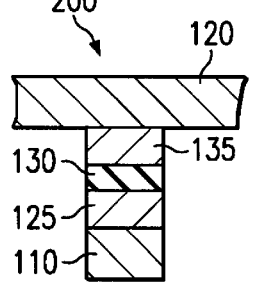
FIG. 2 illustrates a detailed cross-sectional view of a single memory cell of the prior art MRAM storage device displayed in FIG. 1.

Referring now to FIG. 2, a diagram illustrates a cross-sectional view of a single memory cell 200 of the prior art MRAM storage device displayed in FIG. 1. The magnetic stack comprised of the first magnetic layer 125 and the second magnetic layer 135 separated by the dielectric layer 130 lies at a cross-point of the conductive line pair 110 and 120. Note that the diagram of the memory cell 200 is not drawn to scale and is not intended to construe any information regarding the relative geometries of the memory cell 200.

Figure 3:
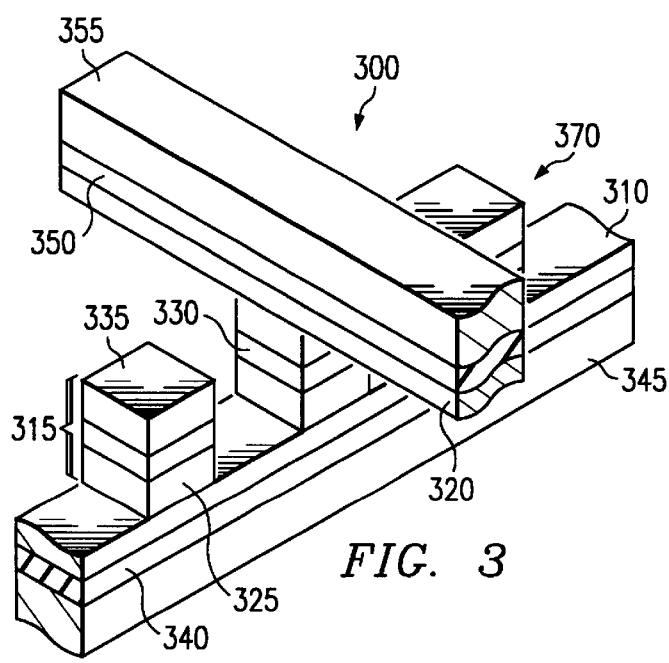
FIG. 3 illustrates a perspective view of a cross-point array MRAM storage device according to a preferred embodiment of the present invention.

Referring now to FIG. 3, a diagram illustrates a perspective view of a cross-point array architecture of a MRAM storage device 300 according to a preferred embodiment of the present invention. The device 300 has conductive lines 310 and 320 running in a first and second direction. The conductive lines 310 and 320 comprised of a conductive material such as aluminum or copper. A magnetic stack 315 is formed over conductive line 310. Notice that as described, the architecture of the device 300 is identical to the architecture of the device 100 as displayed in FIG. 1 and can be fabricated from essentially the same materials.

Laid over the top of conductive line 310 is an isolated conductive line 345 that is electrically separated from the conductive line 310 by a dielectric layer 340. A similar isolated conductive line 355 is laid over the conductive line 320 and it is too electrically separated from the conductive line 320 by a dielectric layer 350. According to a preferred embodiment of the present invention, the isolated conductive lines 345 and 355 run in a parallel fashion over the conductive lines 310 and 320 and are fabricated from a conductive material such as aluminum or copper. It is preferred that the isolated conductive lines 345 and 355 are fabricated in a metal layer that is different from the metal layer containing the conductive lines 310 and 320.

According to a preferred embodiment of the present invention, the isolated conductive lines 345 and 355 are used for writing (aligning) the magnetic stacks, while the conductive lines 310 and 320 are used for reading the contents of the magnetic stacks. The isolated conductive lines 345 and 355 are isolated electrically from the conductive lines 310 and 320 therefore it is possible for different electrical currents and voltages to be present simultaneously on the different conductive lines. The conductive lines 310 and 320 are used to read the contents of the magnetic stacks, as they are in a typical cross-point architecture, such as one shown in FIG. 1. To read the contents of a magnetic stack, a voltage is applied and the resulting current is read. The value stored in the magnetic stack results in different values for the current.

According to a preferred embodiment of the present invention, magnetic stacks can be grouped together based upon their common sharing of wordlines and bitlines. For example, a grouping 370 of magnetic stacks displays a plurality of magnetic stacks sharing a common conductive line 310. A grouping is not displayed for magnetic stacks sharing a common conductive line 320, but in an actual MRAM memory array, they would be present. The groupings of the magnetic stacks based on commonly shared conductive lines are similar to the groupings displayed in FIG. 1.

Figure 4:
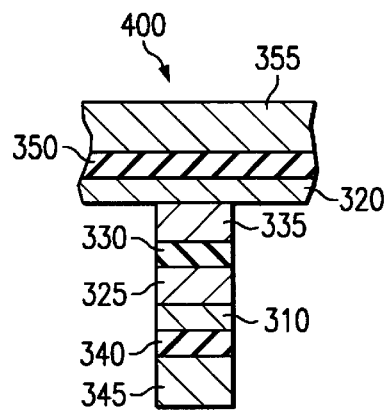
FIG. 4 illustrates a detailed cross-sectional view of a single memory cell of the cross-point array MRAM storage device displayed in FIG. 3.

Referring now to FIG. 4, a diagram illustrates a cross-sectional view of a single memory cell 400 of the cross-point array MRAM storage device displayed in FIG. 3. A simple repetition of the single memory cell 400 in an array pattern is used to implement the cross-point array MRAM storage device. Memory cells with electrically coupled wordlines end-up sharing the wordlines while memory cells with electrically coupled bitlines end-up sharing the bitlines.

The magnetic stack comprised of the first magnetic layer 325 and the second magnetic layer 335 separated by the dielectric layer 330 lies at a cross-point of the conductive line pair 310 and 320. The isolated conductive lines 345 and 355 running parallel to the conductive line pair 310 and 320 are separated from the conductive lines 310 and 320 by dielectric layers 340 and 350. Note that the diagram of the memory cell 400 is not drawn to scale and is not intended to construe any information regarding the relative geometries of the memory cell 400.

Figure 5:
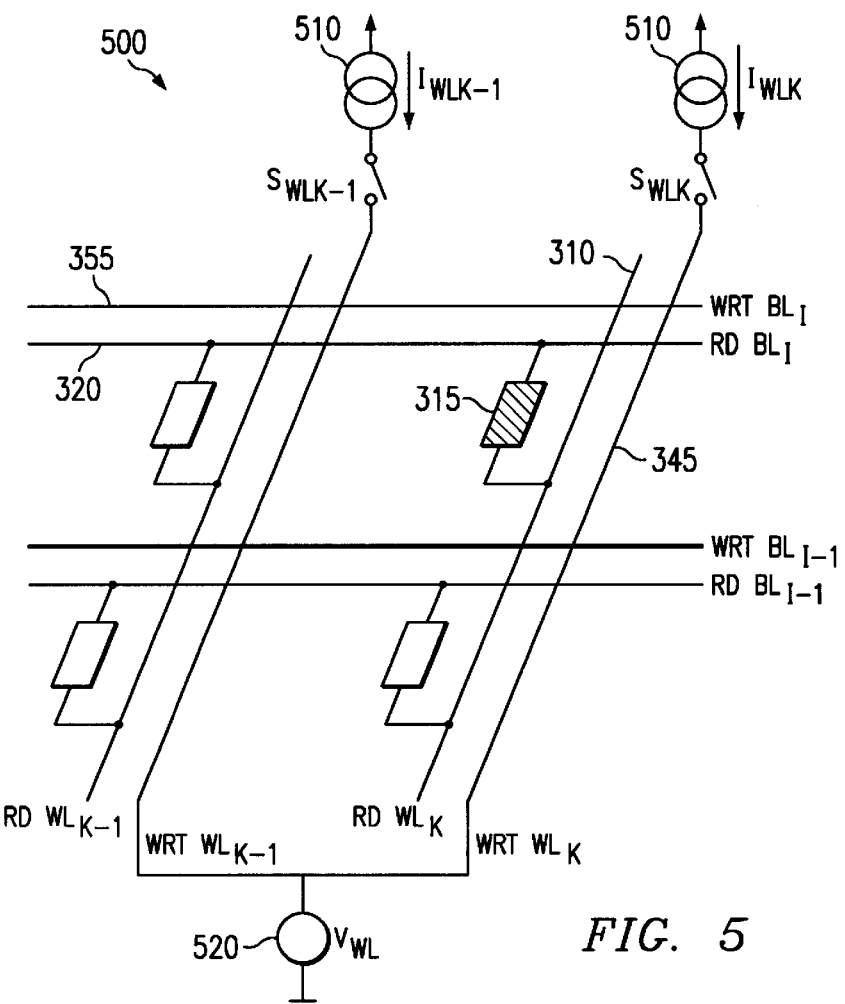
FIG. 5 illustrates an idealized planar view of the cross-point array MRAM storage device displayed in FIG. 3 with exemplary write currents, switches, and voltage sources according to a preferred embodiment of the present invention.

Referring now to FIG. 5, a diagram displays an idealized planar view of the cross-point array architecture of the MRAM storage device 500 displayed in FIG. 3 with exemplary write currents, switches, and voltage sources according to a preferred embodiment of the present invention. The device 500 features conductive lines 310 and 320 that run perpendicular to one another and at the intersection of the conductive lines 310 and 320 is a magnetic stack 315.

The device 500 features a second set of conductive lines, referred to as isolated conductive lines 345 and 355 that run parallel to the conductive lines 310 and 320 respectively. The isolated conductive lines 345 and 355 are electrically isolated from the conductive lines 310 and 320, each other, and the magnetic stack 315. Being electrically isolated from the conductive lines 310 and 320, each other, and the magnetic stack 315 means that currents and voltages on the isolated conductive lines do not interfere with currents and voltages on the conductive lines.

According to a preferred embodiment of the present invention, the isolated conductive lines 345 and 355 function as write wordlines 345 and write bitlines 355 while the conductive lines 310 and 320 function as read wordlines 310 and read bitlines 320, with the names being used interchangeably, meaning that conductive line 345 may actually be the bitline and vice versa. The isolated conductive lines 345 and 355 are used to provide write currents of sufficient magnitude to induce a magnetic field of adequate strength to align (write) the magnetic dipoles of a magnetic stack 315 sandwiched by the intersection of the conductive lines 310 and 320. The conductive lines 310 and 320, on the other hand, are used exclusively to detect the alignment of the magnetic stack 315 to determine the logical value stored therein.

A current source 510 is coupled to the write wordline 345 and provides a current of sufficient magnitude (when in conjunction with a current on the write bitline 355) to align the magnetic dipoles of the magnetic stack 315 flows through the write wordline 345. A voltage drop 520 provides the option of placing any arbitrary voltage level at one end of the write wordlines. Additionally, according to a preferred embodiment of the present invention, switching devices are not necessary at one side of the write wordlines as they would be in the commonly used cross-point array architecture. Also, the write wordlines can be permanently fixed to a common potential.

The dielectric layer 340 and 350 (not shown in FIG. 5) between the isolated conductive lines 345 and 355 and the conductive lines 310 and 320 effectively isolate the conductive lines 310 and 320 from the isolated conductive lines 345 and 355. By being electrically isolated, the isolated conductive lines 345 and 355 are not significantly affected by parasitic effects such as capacitance, inductance, and resistance as are the conductive lines 310 and 320. The parasitic effects arise from the conductive lines 310 and 320 being in physical contact with the magnetic stacks. As parasitic effects typically manifest as signal loss, the currents carried on the isolated conductive lines 345 and 355 remain fairly constant throughout the isolated conductive lines. Therefore, a current applied at one end of an isolated conductive line will appear at the other end without having suffered any appreciable loss.

A reduction in signal loss allows a greater amount of precision in the write current applied to the magnetic stacks. Consider a situation where the write current encounters a significant amount of loss due to parasitic effects. In such a situation, a write current at a desired magnetic stack may be at a lower level then at the beginning of the conductive line. Given the fact that magnetic stacks can be sensitive to the strength of a magnetic field that is induced by a current, the current that is sufficient at the current source may not be sufficient when it arrives at the desired magnetic stack. To further compound the problem with imprecise current values, a current that is too large in magnitude may unintentionally align the magnetic dipoles of magnetic stacks that are overly sensitive. A reduction in signal loss results in a larger write margin, meaning that a particular write current can be used to align a larger number of magnetic stacks and at the same time reducing the probability unintentionally changing the contents of unselected magnetic stacks. Therefore, it is preferred to reduce losses on the conductive lines used to carry the write currents.

The reduction in losses resulting from parasitic effects also leads to longer isolated conductive line runs. With smaller losses, the runs can be made longer and still offer a satisfactory level of performance. Longer conductive lines permit denser memory cell array, increasing the efficiency of the memory by reducing the amount of support logic and devices such as current sources and sinks, voltage drops, etc.

The presence of the isolated conductive line lying over the conductive lines used for reading the magnetic stacks also functions as an interference shield to the read lines. The shielding permits the use of the MRAM storage cell in a noisier environment without having to increase the voltage levels on the read lines. Alternatively, the increased shielding permits a lower voltage level on the read lines. The decreased voltage levels will result in lower power consumption and faster performance due to shorter signal rise and fall times. Additionally, smaller voltage levels require smaller voltage sources, making the voltage sources easier to place within the periphery circuitry of the array.

The separation of the write lines from the read lines also permits faster switching time from a write operation to a read operation and vice versa. In the prior art cross-point array architecture (FIG. 1), when no operation (neither read nor write) is being performed, a quiescent voltage of approximately 0.5 volts may be maintained on the wordlines and the bitlines. When write operation is desired, the appropriate write current is applied to the lines. The application of the current will instantaneously result in a significant voltage drop (of approximately 1.0 volts) appearing on the lines. When the write operation is complete, time must be spent waiting for the voltage to drop back down to quiescent levels.

The disjoint architecture of the present invention prevents this from occurring because the quiescent voltage can be maintained on the read lines while the write current can be applied on the write lines without disturbing the voltage on the read lines. Therefore, no time is required to permit the voltage levels to drop back down to quiescent levels and a read operation can be performed sooner after the completion of a write operation.

In some memory storage devices, the inner cross-point array needs to be segmented. The present invention easily permits the segmentation of the inner array via the use of small transistors. The transistors may be small in size due to the small read currents that flow in the inner array. Conventional cross-point array architectures require large transistors due to the significantly larger write currents that also flow through the array. The use of small transistors permits a denser packing of the memory cells, reducing the overall size of the memory storage device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A magnetoresistive random access memory (MRAM) storage device comprising:
    an MRAM memory cell containing a magnetic tunnel junction (MTJ), a wordline and a bitline lying perpendicular to the wordline, sandwiching the MTJ at their intersection, the MRAM memory cell capable of storing a value magnetically;
    a first conductive line running parallel to the wordline, electrically separated from the wordline by a first dielectric layer; and
    a second conductive line running parallel to the bitline, electrically separated from the bitline by a second dielectric layer.

2. The storage device of claim 1, wherein the first conductive line is fabricated on a first side of the wordline that is different from a second side that is in contact with the MTJ and the first side is opposite to the second side.

3. The storage device of claim 1, wherein the second conductive line is fabricated on a first side of the bitline that is different from a second side that is in contact with the MTJ and the first side is opposite to the second side.

4. The storage device of claim 1, wherein the first and second conductive lines lie perpendicular to each other.

5. The storage device of claim 1, wherein the first and second conductive lines are fabricated in different metal layers.

6. The storage device of claim 1, wherein the wordline and first conductive line are fabricated in different metal layers.

7. The storage device of claim 1, wherein the bitline and second conductive line are fabricated in different metal layers.

8. The storage device of claim 1, wherein the MTJ comprises a first magnetic layer and a second magnetic layer separated by a non-magnetic layer.

9. The storage device of claim 1, wherein the wordline and the bitline are used to read the value magnetically stored in the MTJ.

10. The storage device of claim 9, wherein a voltage is applied to the wordline and the bitline and a current is sensed to determine the value magnetically stored in the MTJ.

11. The storage device of claim 1, wherein the first and second conductive lines are used to write the value magnetically stored in the MTJ.

12. The storage device of claim 11, wherein a first current applied on the first conductive line and a second current applied on the second conductive line induce a magnetic field of sufficient strength to align magnetic dipoles in the MTJ.

13. The storage device of claim 12, wherein the currents applied on the first and second conductive lines to write a value to the MTJ can occur simultaneously with a voltage applied on the wordline and bitline to read the value stored in the MTJ.

14. The storage device of claim 13, wherein the read operation must wait until the write operation is complete prior to starting.

15. The storage device of claim 1, wherein each MRAM memory cell lying on a common wordline also share a common first conductive line.

16. The storage device of claim 1, wherein each MRAM memory cell lying on a common bitline also share a common second conductive line.

17. A magnetoresistive random access memory (MRAM) memory array arranged in a cross-point array with a plurality of wordlines and bitlines, the memory array comprising a plurality of MRAM memory cells arranged in a cross-point array, each MRAM memory cell comprising:
    a magnetic tunnel junction (MTJ) comprising a first and second magnetic layers separated by a non-magnetic layer, a wordline and a bitline lying perpendicular to the wordline, sandwiching the MTJ at their intersection;
    a first conductive line running parallel to the wordline, electrically separated from the wordline by a first dielectric layer; and
    a second conductive line running parallel to the bitline, electrically separated from the bitline by a second dielectric layer; and
    wherein subsets of MRAM memory cells are grouped together and share a common wordline and subsets of MRAM memory cells are grouped together and share a common bitline.

18. The magnetoresistive random access memory (MRAM) memory array of claim 17, wherein a quiescent voltage is maintained on the common bitline and the common writeline, a write current can be applied to the parallel conductive lines while maintaining the quiescent voltage.

19. The magnetoresistive random access memory (MRAM) memory array of claim 17, wherein the common bitlines and the common wordlines are segmented.

20. The magnetoresistive random access memory (MRAM) memory array of claim 19, wherein the parallel conductive lines are unsegmented.

21. A circuit comprising a MRAM storage device as specified in claim 1.

22. An electronic device comprising a MRAM storage device as specified in claim 1.

* * * * *